United States Patent [19]

Smith et al.

[11] 4,206,897

[45] Jun. 10, 1980

[54] SELF-ADJUSTING SPRING RETAINER

[75] Inventors: Robert Smith; Douglas C. Heighton, both of Dayton, Ohio

[73] Assignee: White Consolidated Industries, Inc., Cleveland, Ohio

[21] Appl. No.: 962,910

[22] Filed: Nov. 22, 1978

[51] Int. Cl.² ............................................. F16M 13/00
[52] U.S. Cl. .................................................... 248/505
[58] Field of Search .................. 248/27.1, 27.3, 154, 248/302, 505, 680

[56] References Cited

U.S. PATENT DOCUMENTS

| | | | |
|---|---|---|---|
| 383,092 | 5/1888 | Baker | 248/302 |
| 2,449,646 | 9/1948 | Emde | 248/505 X |
| 3,025,337 | 3/1962 | Leoni | 248/27.3 X |
| 3,131,896 | 5/1964 | Ingrahm | 248/505 X |
| 3,159,365 | 12/1964 | Watson | 248/27.1 |
| 3,849,838 | 11/1974 | Heyl | 24/73 C |

*Primary Examiner*—William H. Schultz
*Attorney, Agent, or Firm*—Pearne, Gordon, Sessions, McCoy & Granger

[57] ABSTRACT

A spring fastener for supporting circuit components or the like to a mounting surface. The fastener consists of a length of resilient wire bent into a pair of arms extending from both sides of a U-shaped base so as to be substantially normal thereto. Lower arm sections are disposed in spaced diverging relation in a common plane while upper arm sections extend in converging relation crossing each other in scissors-like fashion adjacent their midportion. The arms terminate in retainer legs spaced to receive the component with the legs located in a plane substantially parallel to the plane of the U-shaped base. The crossed upper sections change angularity by scissors-like movement to urge the component into retaining engagement with the support panel to compensate for variations in dimensions of the component.

1 Claim, 4 Drawing Figures

SELF-ADJUSTING SPRING RETAINER

This invention relates to a spring retainer or fastener for fastening the casing of a component, such as a circuit, to a support panel.

Resilient support fasteners or securing devices for attaching components such as circuit components, semiconductors, or the like to a mounting surface are well known in the art. It has been found that such prior art devices are unsatisfactory for compensating for variations in the size of the component. Furthermore, prior retainers formed of strips or flat stock spring steel, molded plastic, etc., their cost and installation time involves considerable expense when such devices are used in quantity. Further, such prior art devices may present sharp edges subject to unwanted contact with electrical leads.

Accordingly, it is an object of the present invention to provide an improved spring fastener readily fabricated from a single length of resilient wire which may quickly and easily be adapted for mounting the casing of a circuit component, semiconductor or the like to a support panel. The fastener includes a pair of arms extending from both sides of a U-shaped base and adapted to be substantially parallel to the support panel, at a defined distance therefrom, with portions of the arms extending in upwardly converging relation and crossing each other in scissors-like fashion. The arms terminate in retainer legs extending inwardly toward the support panel whereby upon the component, having a predetermined size subject to tolerance variations being received between the legs it is engaged by the crossed arms, resulting in the crossed arms changing angularity by scissors-like movement upon being subjected to outward stress from the component. The spring fastener is structured to exert an inward force toward the support panel to thereby urge the component into retaining engagement with the panel such that tolerance variations in the size of the component are compensated by the scissors-like movement of the arms.

Further objects and advantages of the present invention will become more apparent as the description proceeds with the aid of the accompanying drawings wherein.

Figure 1:
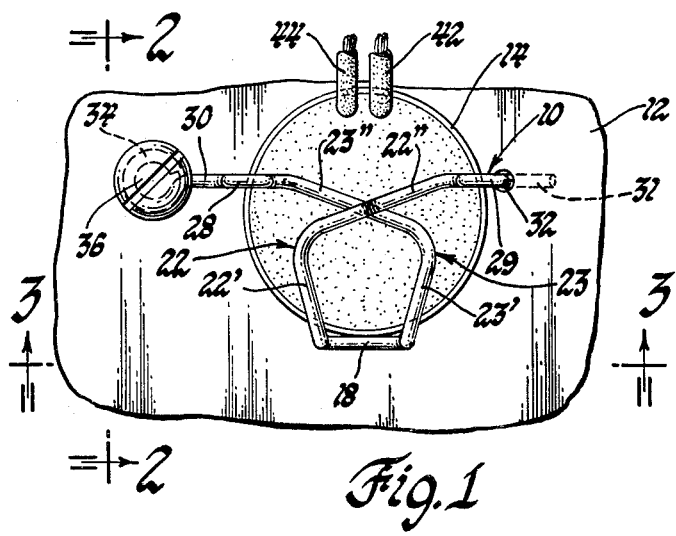
FIG. 1 is a front elevational view of the device fastening a circuit component on a support panel according to the invention.

Referring now to the drawings, there is illustrated in FIGS. 1-4 a spring fastener generally indicated at 10, adapted to be used in conjunction with a support wall or panel 12 for mounting a component, such as the casing of a circuit component 14 or the like, to the panel. The fastener is constructed from a single length of resilient wire, for example steel, which is bent to form a generally U-shaped base shown disposed in a first plane substantially normal to the plane of the panel 12. The U-shaped base includes a bight portion 18 and side portions 20 and 21 joined to the opposite ends of the bight portion and extending outwardly therefrom away from the support panel 12.

Figure 4:
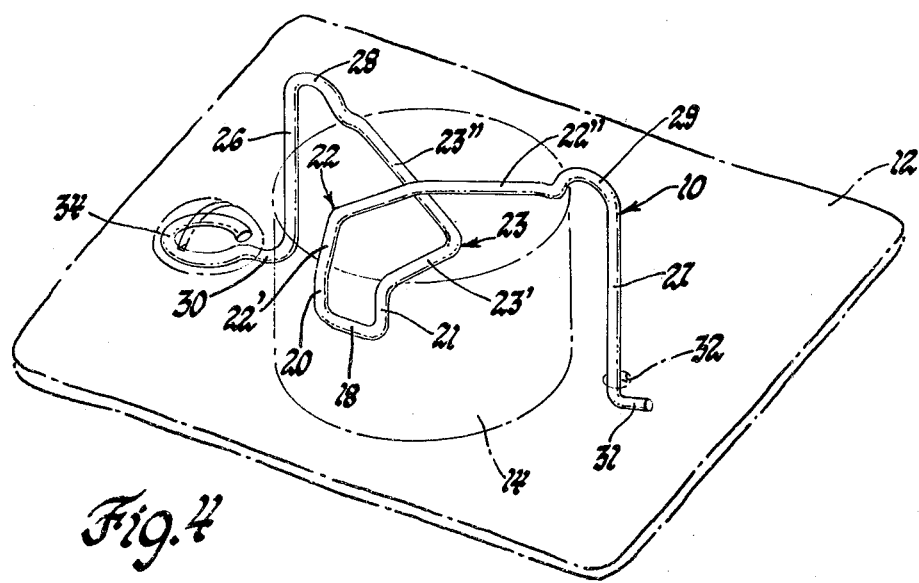
FIG. 4 is a perspective view of the spring fastener with the retained circuit component and support panel shown in phantom.

A pair of arms, generally indicated at 22 and 23 in FIGS. 1 and 4, are each bent so as to extend from the both side portions 20 and 21 respectively, of the base so as to be normal to the plane of the U-shaped base thereto and generally parallel to the support panel 12 upon the fastener 10 being secured thereto. Each of the arms 22 and 23 includes a lower section 22', 23' and an upper section 22" and 23" respectively. The lower sections 22' and 23' are disposed in spaced diverging relation substantially in a common plane normal to the plane of the U-shaped base. Each of the upper sections 22" and 23" extend in an upwardly converging relation so as to cross each other in scissors-like fashion adjacent the midportion of each of the upper portions 22" and 23".

Figure 3:
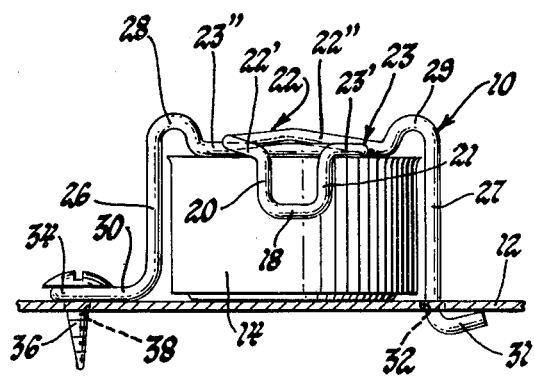
FIG. 3 is a bottom elevational view, partly in section, taken substantially on the line 3—3 of FIG. 1.
Figure 2:
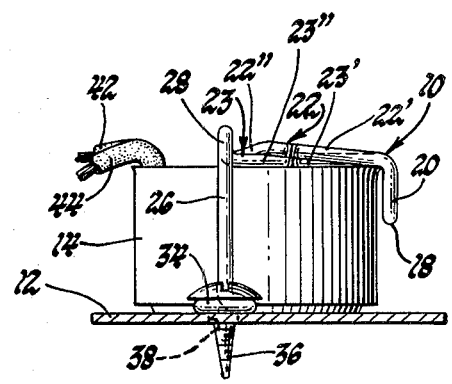
FIG. 2 is a side elevational view, partly in section, taken substantially on the line 2—2 of FIG. 1.

As shown in FIGS. 3 and 4, a pair of retainer legs 26 and 27 are each joined by their associated open loop sections 28 and 29 respectively, to the ends of their respective arm upper sections 23" and 22". It will be noted that the retainer legs 26, 27 extend inwardly toward the support panel 12 so as to be disposed, together with their respective open loop sections 28 and 29 in a second plane substantially parallel to the first plane of the U-shaped base. The legs 26 and 27 each have their distal ends terminating in bent-over end portions 30 and 31, respectively. The end portions are shown extending in opposite directions substantially in the second plane defined by the legs 26 and 27.

It will be noted that one of the end portions, which in the disclosed embodiment is end portion 31, formed at the distal end of leg 27, defines a hook adapted for limited movable engagement within panel aperture means in the form of a hole 32 extending through the support panel 12. The other of the end portions, which in the disclosed embodiment is end portion 30 formed at the distal end of leg 26, terminates in means such as closed loop 34. The closed loop is positioned in juxtaposed relation with the support panel 12 and adapted for reception of retainer means which in the preferred embodiment is a metal screw 36 threadably received in hole 38 of the panel.

Thus, it will be seen that applicant's fastener 10 has been secured to support panel 12 such that upon the component 14 being received between the legs 26 and 27 it will be engaged by the crossed upper arm portions 22" and 23" causing the arms to change angularity by scissors-like movement of the arms upon being subjected to outward stress from the circuit component. It will be appreciated that such movement results in the spring fastener upper sections 22" and 23" exerting an inward force on the component 14 toward the support panel 12 to thereby urge the component into retaining engagement with the support panel.

From the foregoing it will be apparent that variations in dimensions of the circuit component are compensated by applicant's scissors-like movement incorporated in his fastener.

In the form disclosed the circuit component 14 is a defrost thermostat shown with a pair of electrical leads 42, 44 extending upwardly in an unobstructed manner from the component. The U-shaped base is located on the underside of the component so as to partially entrap same while allowing for limited rotation thereof to accomodate the leads at various upwardly projecting angles depending upon the location of other components of the circuit.

While the embodiment of the present invention as herein disclosed constitutes a preferred form, it is to be understood that other forms might be adopted.

The embodiments of the invention in which an exclusive property or privilege is claimed are defined as follows:

1. A spring fastener formed of a single length of resilient wire and adapted for mounting the casing of a circuit component to an apertured support panel, said spring fastener comprising a U-shaped base disposed in a first plane substantially normal to said panel, said base including a bight portion and side portions joined to opposite ends of said bight portion and extending outwardly therefrom away from said support panel, a pair of arms extending from the both side portions of said base and adapted to be substantially parallel to said panel, each said arm including a lower section and an upper section, said lower sections being disposed in spaced diverging relation in a common plane, each said upper section being extended in upwardly converging relation and crossing each other in scissors-like fashion adjacent the midportion thereof, respective retainer legs joined by open loop sections to the ends of said upper sections, said retainer legs extending inwardly toward the support panel so as to be disposed, together with their respective open loop sections, in a second plane substantially parallel to said first plane, said legs each terminating in a bent-over end portion and extending in opposite directions in said second plane, one of said end portions defining a hook adapted for limited movable engagement with aperture means in the support panel, the other said end portion terminating in means adapted for reception of retainer means for fixedly attaching the other said end portion to the support panel, whereby upon the circuit component being received between said legs so as to be engaged by said crossed upper sections, said crossed upper sections changing angularity by scissors-like movement of said arms upon being subjected to outward stress from the circuit component resulting in said spring fastener upper sections exerting an inward force toward said support panel to thereby urge said component into retaining engagement with the support panel, such that variations in dimensions of the circuit component are compensated by the scissors-like movement of said arms.

* * * * *